US012573990B2

(12) United States Patent
Zhou et al.

(10) Patent No.: US 12,573,990 B2
(45) Date of Patent: Mar. 10, 2026

(54) RECEIVING CIRCUIT FOR ADAPTIVE IMPEDANCE MATCHING AND OPERATING METHOD THEREOF

(71) Applicant: Beijing Onmicro Electronics Co., Ltd., Beijing (CN)

(72) Inventors: Zhongliang Zhou, Beijing (CN); Yongxue Qian, Beijing (CN); Xin Huang, Beijing (CN); Hao Meng, Beijing (CN); Guangjie Cai, Beijing (CN); Chun fai Wong, Beijing (CN); Kam hung Chan, Beijing (CN); Tai yin Wong, Beijing (CN)

(73) Assignee: BEIJING ONMICRO ELECTRONICS CO., LTD., Beijing (CN)

( * ) Notice: Subject to any disclaimer, the term of this patent is extended or adjusted under 35 U.S.C. 154(b) by 420 days.

(21) Appl. No.: 18/298,133

(22) Filed: Apr. 10, 2023

(65) Prior Publication Data

US 2024/0039488 A1     Feb. 1, 2024

(30) Foreign Application Priority Data

Jul. 26, 2022     (CN) .......................... 202210884762.7

(51) Int. Cl.
| | |
|---|---|
| *H03F 3/191* | (2006.01) |
| *H03F 1/08* | (2006.01) |
| *H03F 3/24* | (2006.01) |

(52) U.S. Cl.
CPC ............. *H03F 3/245* (2013.01); *H03F 1/086* (2013.01); *H03F 2200/451* (2013.01)

(58) Field of Classification Search
CPC .................................... H03F 3/191; H03F 1/07
USPC ...................................... 330/302, 124 R, 295
See application file for complete search history.

(56) References Cited

U.S. PATENT DOCUMENTS

| | | | |
|---|---|---|---|
| 9,306,603 B2 | 4/2016 | Lee et al. | |
| 9,407,482 B2 | 8/2016 | Aggarwal et al. | |
| 9,673,155 B2 | 6/2017 | Smith et al. | |
| 9,929,760 B2 * | 3/2018 | Chu ...................... | H03F 3/3022 |
| 12,212,351 B2 * | 1/2025 | Agrawal .............. | H04B 1/0483 |
| 2014/0335808 A1 * | 11/2014 | Pullela ..................... | H03G 5/28 |
| | | | 455/188.1 |
| 2017/0302316 A1 | 10/2017 | Chu et al. | |

* cited by examiner

*Primary Examiner* — Henry Choe

(74) *Attorney, Agent, or Firm* — Carter, DeLuca & Farrell LLP

(57) ABSTRACT

The present disclosure provides a receiving circuit for adaptive impedance matching and an operating method thereof. The receiving circuit includes: a first amplification module configured to amplify an input signal input from an input end of the first amplification module to generate a first amplified signal; a frequency mixing module, an input end of which is connected to an output end of the first amplification module, and configured to down-convert the first amplified signal to generate a down-converted signal; and a second amplification module, an input end of which is connected to an output end of the frequency mixing module, and configured to amplify the down-converted signal to generate an output signal, wherein the first amplification module includes an active negative feedback structure for providing adaptive impedance matching in a first bandwidth range.

10 Claims, 3 Drawing Sheets

500

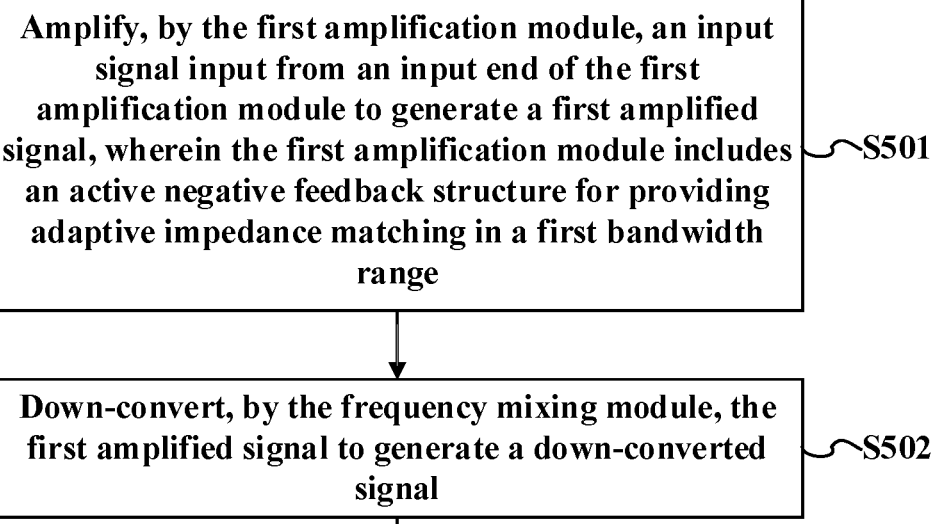

Amplify, by the first amplification module, an input signal input from an input end of the first amplification module to generate a first amplified signal, wherein the first amplification module includes an active negative feedback structure for providing adaptive impedance matching in a first bandwidth range ⎯S501

Down-convert, by the frequency mixing module, the first amplified signal to generate a down-converted signal ⎯S502

Amplify, by the second amplification module, the down-converted signal to generate an output signal ⎯S503

FIG. 5

RECEIVING CIRCUIT FOR ADAPTIVE IMPEDANCE MATCHING AND OPERATING METHOD THEREOF

TECHNICAL FIELD

The present disclosure relates to a technical field of circuit systems, and more particularly, to a receiving circuit for adaptive impedance matching and an operating method thereof.

BACKGROUND

With the rapid development of mobile communication technology, people's requirements for wireless applications are increasing day by day, especially for Internet of Things applications now. Impedance matching is an indispensable component for wireless applications. However, in different application scenarios, different requirements are put forward for matching circuits and performance of RF receivers, such as the operating frequencies and available bandwidths thereof. At present, a common matching circuit usually takes use of discrete passive devices outside of a chip, but the use of discrete passive devices would increase the cost and the available operating bandwidth would be limited to some extent by the discrete passive devices.

SUMMARY

Technical Problems

At present, a conventional RF receiver needs to use peripheral discrete passive devices for impedance matching. When a ratio of an available bandwidth to an operating bandwidth required for the operation of an application is 10% (herein, taking a 470 MHz~510 MHz frequency band as an example, the available bandwidth is the width of the frequency band, i.e., 40 MHz, and the operating bandwidth is the central frequency of the frequency band, i.e., 490 MHz), because the peripheral discrete passive devices have constraints by a quality factor (e.g., the Q value), a single-stage LC matching circuit can't cover the ratio of the available bandwidth to the operating bandwidth of 10%. In this case, a pi network or a two-stage LC is needed, but this would increase peripheral devices and noise, thus reducing the performance of the receiver.

In addition, matching in a wide frequency band may lead that blocking signal and useful signal can not be well separated, and the blocking signal and the useful signal will be received into the receiver at the same time, thus increasing the pressure of the baseband circuit at the later stage of the receiver, for example, separating the useful signal from the blocking signal.

The conventional receiver needs to change the matching circuits to adapt to different operating frequencies and operating bandwidths, for example, by changing different groups of matching circuits inside or outside the package or chip in order to switch in different operating frequencies and operating bandwidths. For blocking, the conventional receiver usually uses a surface acoustic wave (SAW) filter to isolate the blocking signal, so as to improve the blocking signal isolation performance. In addition, another effective way against blocking is to isolate the blocking signal by using an N-path filter, but the power consumption will be greatly increased in this design.

Solution to the Problems

Embodiments of the present disclosure provide a receiving circuit for adaptive impedance matching, which includes: a first amplification module configured to amplify an input signal input from an input end of the first amplification module to generate a first amplified signal; a frequency mixing module, an input end of which is connected to an output end of the first amplification module, and configured to down-convert the first amplified signal to generate a down-converted signal; and a second amplification module, an input end of which is connected to an output end of the frequency mixing module, and configured to amplify the down-converted signal to generate an output signal, wherein the first amplification module includes an active negative feedback structure for providing adaptive impedance matching in a first bandwidth range.

According to an embodiment of the present disclosure, the active negative feedback structure includes an active negative feedback low noise amplifier, wherein the active negative feedback low noise amplifier includes a feedback transistor, a bias transistor, a first amplification transistor and a second amplification transistor, wherein, a source of the first amplification transistor is connected to a power supply voltage, a gate of the first amplification transistor is connected to the input end of the first amplification module, and a drain of the first amplification transistor is connected to the output end of the first amplification module; a drain of the second amplification transistor is connected to the output end of the first amplification module, a gate of the second amplification transistor is connected to the input end of the first amplification module, and a source of the second amplification transistor is connected to a ground voltage; a drain of the feedback transistor is connected to the power supply voltage, a gate of the feedback transistor is connected to the output end of the first amplification module, and a source of the feedback transistor is connected to the input end of the first amplification module; and a drain of the bias transistor is connected to the input end of the first amplification module, a gate of the bias transistor is connected to a bias voltage, and a source of the bias transistor is connected to the ground voltage.

According to an embodiment of the present disclosure, a transconductance of the feedback transistor is adjusted via the bias voltage.

According to an embodiment of the present disclosure, the frequency mixing module includes a quadrature passive mixer, which includes a local oscillator and first to fourth switching transistors, wherein the local oscillator generates first to fourth local oscillator signals whose phases are sequentially increased by 90 degrees to control switching states of the first to fourth switching transistors.

According to an embodiment of the present disclosure, sources of the first to fourth switching transistors are respectively connected to the output ends of the first amplification module; a gate of the first switching transistor is connected to the first local oscillator signal, and a drain of the first switching transistor is connected to a first output path of the frequency mixing module; a gate of the second switching transistor is connected to the third local oscillator signal, and a drain of the second switching transistor is connected to the first output path of the frequency mixing module; a gate of the third switching transistor is connected to the second local oscillator signal, and a drain of the third switching transistor is connected to a second output path of the frequency mixing module; and a gate of the fourth switching transistor is connected to the fourth local oscillator signal, and a drain of the fourth switching transistor is connected to the second output path of the frequency mixing module.

According to an embodiment of the present disclosure, the second amplification module includes one or more transimpedance amplifiers, input ends of which are respectively connected to one or more output paths of the frequency mixing module, and respectively amplify signals output via the one or more output paths of the frequency mixing module.

According to an embodiment of the present disclosure, the active negative feedback structure includes a feedback transistor, and wherein the first bandwidth range is determined based at least in part on transconductance of the feedback transistor.

According to an embodiment of the present disclosure, the first bandwidth range is any one or more of 220 MHz to 240 MHz, 433.05 MHz to 433.79 MHz, 902 MHz to 928 MHz, 240 MHz to 470 MHz, 470 MHz to 510 MHz and 220 MHz to 510 MHz.

According to an embodiment of the present disclosure, the input signal is a radio frequency voltage signal, and the first amplified signal is a radio frequency current signal.

According to an embodiment of the present disclosure, the down-converted signal is one or more intermediate frequency or baseband current signals, and the output signal is one or more intermediate frequency or baseband voltage signals.

Embodiments of the present disclosure provide an operating method of a receiving circuit for adaptive impedance matching, the receiving circuit including a first amplification module, a frequency mixing module and a second amplification module, the method including: amplifying, by the first amplification module, an input signal input from an input end of the first amplification module to generate a first amplified signal; down-converting, by the frequency mixing module, the first amplified signal to generate a down-converted signal; and amplifying, by the second amplification module, the down-converted signal to generate an output signal, wherein the first amplification module includes an active negative feedback structure for providing adaptive impedance matching in a first bandwidth range.

Advantageous Effects of the Invention

Embodiments of the present disclosure provide a receiving circuit for adaptive impedance matching, which effectively solves a problem that peripheral discrete passive devices are required for impedance matching by adopting an active negative feedback structure. The receiving circuit according to the embodiments of the present disclosure can adaptively perform impedance matching with respect to different channels in available bandwidths and isolate blocking signals without any peripheral discrete passive device, and without any additional power consumption, thereby improving the performance of the receiver.

BRIEF DESCRIPTION OF THE DRAWINGS

The above and other aspects, features and advantages of certain embodiments of the present disclosure will become more apparent from the following description taken in conjunction with the accompanying drawings, in which:

FIG. 5 shows a flowchart of an operating method of a receiving circuit for adaptive impedance matching according to the embodiments of the present disclosure.

DETAILED DESCRIPTION OF THE EMBODIMENTS

Figure 1:
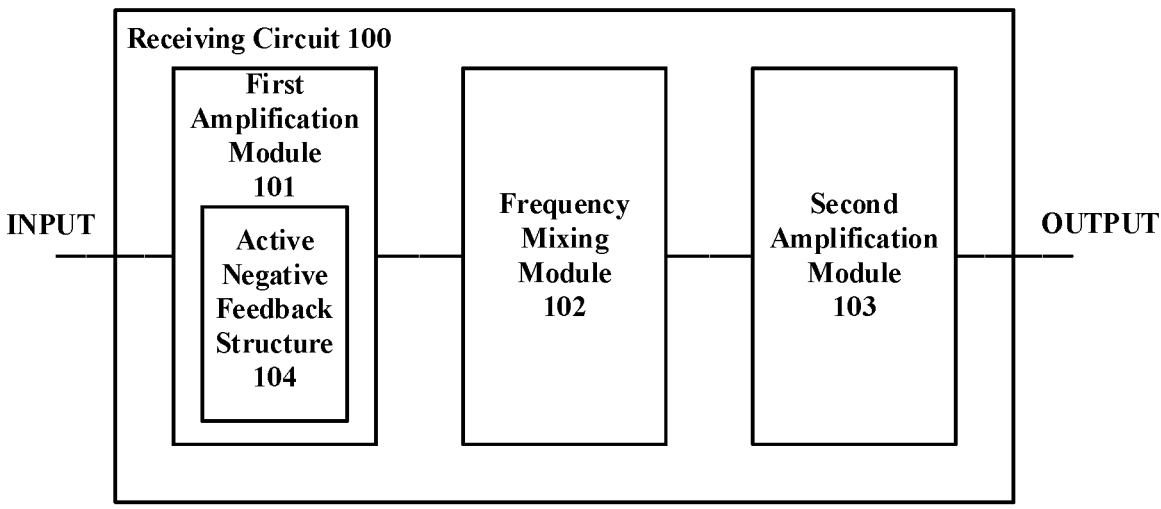
FIG. 1 shows a schematic diagram of a receiving circuit for adaptive impedance matching according to the embodiments of the present disclosure.

Before proceeding to the following detailed description, it may be advantageous to set forth the definitions of certain words and phrases used throughout the present patent document. The terms "couple", "connect" and their derivatives refer to any direct or indirect communication or connection between two or more elements, whether those elements are in physical contact with each other or not. The terms "transmit", "receive" and "communicate" and their derivatives encompass both direct and indirect communication. The terms "include" and "contain" and their derivatives mean including but not limited to. The term "or" is inclusive, and means and/or. The phrases "associated with", "corresponding to" and their derivatives mean to include, be included in, interconnect, contain, be contained in, connect to or be connected with, couple to or be coupled with, communicate with, cooperate with, interweave, juxtapose, approach, bind to or be bound with, have, have property of, have a relationship with and be related to, etc. The term "controller" refers to any device, system or part thereof that controls at least one operation. Such a controller may be implemented in hardware, or a combination of hardware and software and/or firmware. Functions associated with any particular controller may be centralized or distributed, whether local or remote. The phrase "at least one of", when used with a list of items, means that different combinations of one or more of the listed items may be used, and only one item in the list may be needed. For example, "at least one of A, B and C" includes any of the following combinations: A, B, C, A and B, A and C, B and C, A and B and C.

Definitions of other certain words and phrases are provided throughout the present patent document. It should be understood by those of ordinary skill in the art that in many cases, even if not most cases, such definitions are also applicable to the previous and future use of the words and phrases such defined.

In the present patent document, application combination of modules and division hierarchy of sub-modules are only used for illustration, and without departing from the scope of the present disclosure, the application combination of modules and the division hierarchy of sub-modules may have different ways. Embodiments of the present disclosure may be implemented in different forms, and should not be construed as limited to the embodiments set forth herein. On the contrary, these embodiments are provided so that the present disclosure will be thorough and complete, and will fully convey exemplary implementations to those skilled in the art. Embodiments of the present disclosure may be combined to form additional embodiments.

The present disclosure will be described in detail below with reference to exemplary embodiments of the present disclosure. However, the present disclosure is not limited to the embodiments described herein, which can be implemented in many different forms. The described embodiments are only used to make the present disclosure thorough and complete, and fully convey the concept of the present disclosure to those skilled in the art. The features of the various described embodiments can be combined or replaced with each other, unless it is explicitly excluded or should be excluded according to the context.

FIG. 1 shows a schematic diagram of a receiving circuit 100 for adaptive impedance matching according to the embodiments of the present disclosure.

As shown in FIG. 1, the receiving circuit 100 for adaptive impedance matching according to the embodiments of the present disclosure may include a first amplification module 101, a frequency mixing module 102, and a second amplification module 103. In some embodiments, the first amplification module 101 may be configured to amplify an input signal INPUT (e.g., it may be a radio frequency (RF) voltage signal) input from an input end of the first amplification module 101 to generate a first amplified signal. An input end of the frequency mixing module 102 may be connected to an output end of the first amplification module 101, and the frequency mixing module 102 may be configured to down-convert the first amplified signal output by the first amplification module 101 to generate a down-converted signal. An input end of the second amplification module 103 may be connected to an output end of the frequency mixing module 102, and the second amplification module 103 may be configured to amplify the down-converted signal output by the frequency mixing module 102 to generate an output signal OUTPUT of the receiving circuit 100. According to an embodiment of the present disclosure, the first amplification module 101 may include an active negative feedback structure 104, which is used for providing adaptive impedance matching in a first bandwidth (e.g., a specific available bandwidth), and the structural configuration of which will be described in detail below.

Figure 2:
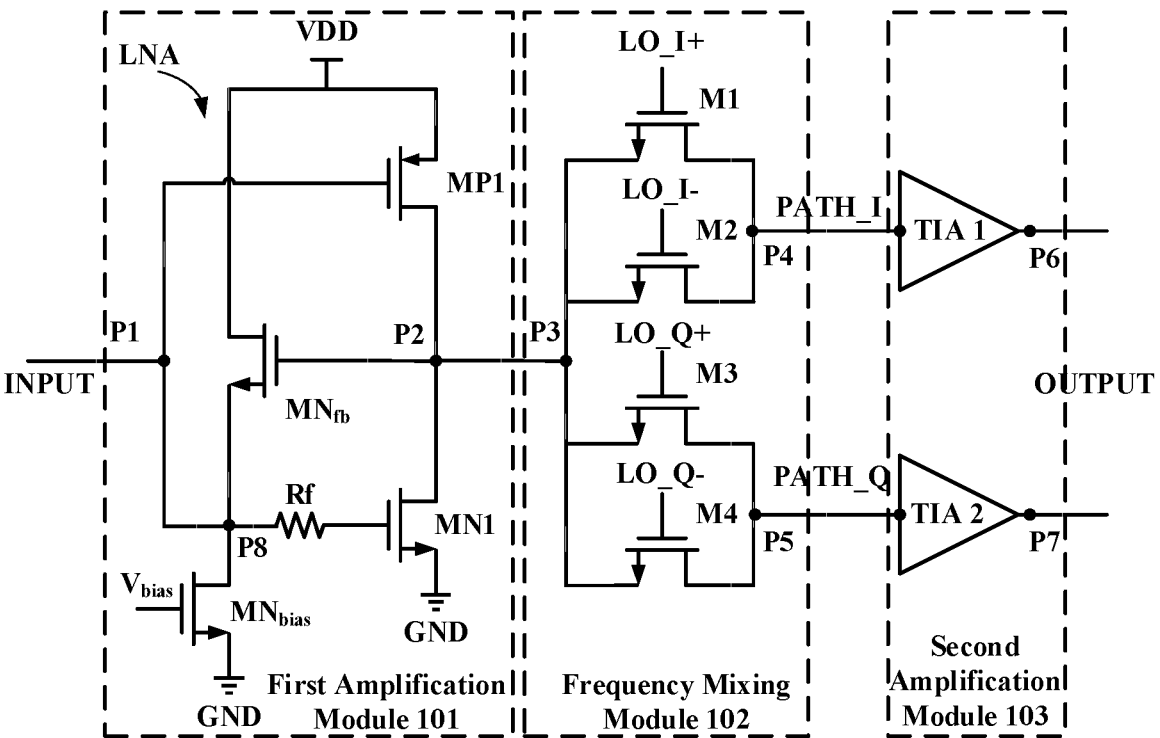
FIG. 2 shows an example circuit diagram of a receiving circuit for adaptive impedance matching according to the embodiments of the present disclosure.

More specifically, FIG. 2 shows an example circuit diagram of a receiving circuit 100 for adaptive impedance matching according to the embodiments of the present disclosure.

As shown in FIG. 2, the active negative feedback structure 104 included in the first amplification module 101 may be an active negative feedback low noise amplifier LNA. In some embodiments, the active negative feedback low noise amplifier LNA may include a feedback transistor $MN_{fb}$, a bias transistor $MN_{bias}$, a first amplification transistor MP1, and a second amplification transistor MN1. It should be understood that depending on the specific circuit configuration, each of these transistors may be one of any type of transistors such as a P-type transistor (e.g., a PMOS transistor), an N-type transistor (e.g., an NMOS transistor), etc., without limitation herein.

In some embodiments, as shown in FIG. 2, the first amplification transistor MP1 may be a P-type transistor, and the feedback transistor $MN_{fb}$, the bias transistor $MN_{bias}$, and the second amplification transistor MN1 may be N-type transistors. As shown in FIG. 2, a source of the first amplification transistor MP1 may be connected to a power supply voltage VDD, a gate thereof may be connected to the input end P1 of the first amplification module 101, and a drain thereof may be connected to the output end P2 of the first amplification module 101. A drain of the second amplification transistor MN1 may be connected to the output end P2 of the first amplification module 101, a gate thereof may be connected to the input end P1 of the first amplification module 101, and a source thereof may be connected to a ground voltage GND. In some embodiments, a feedback resistor Rf may be optionally connected between the gate of the second amplification transistor MN1 and the input end P1 of the first amplification module 101, in order to adjust a gate voltage of the second amplification transistor MN1. A drain of the feedback transistor $MN_{fb}$ may be connected to the power supply voltage VDD, a gate thereof may be connected to the output end P2 of the first amplification module 101, and a source thereof may be connected to the input end P1 of the first amplification module 101. A drain of the bias transistor $MN_{bias}$ may be connected to the input end P1 of the first amplification module 101, a gate thereof may be connected to a bias voltage $V_{bias}$, and a source thereof may be connected to the ground voltage GND.

In some embodiments, the available bandwidth (e.g., the first bandwidth range) in which adaptive impedance matching can be performed by the receiving circuit 100 with the example structure according to the embodiments of the present disclosure may be determined based at least in part on a transconductance $gm_{fb}$ of the feedback transistor $MN_{fb}$. Feedback transistors $MN_{fb}$ with different transconductance values may correspond to different available bandwidths and/or operating bandwidths. For example, when a feedback transistor $MN_{fb}$ with a first transconductance value is selected, an available bandwidth in which adaptive impedance matching can be performed by the receiving circuit 100 may be 470 MHz~510 MHz; when a feedback transistor $MN_{fb}$ with a second transconductance value is selected, an available bandwidth in which adaptive impedance matching can be performed by the receiving circuit 100 may be 220 MHz~240 MHz; and so on. Further, the transconductance $gm_{fb}$ of the feedback transistor $MN_{fb}$ may be further adjusted by adjusting the gate voltage of the bias transistor $MN_{bias}$ via the bias voltage $V_{bias}$. Therefore, without changing the circuit structure or the connection mode or on-off state of circuit elements, it is possible to change the bandwidth range in which adaptive impedance matching can be performed by the receiving circuit 100 with the example structure according to the embodiments of the present disclosure, such as switching between 220 MHz~240 MHz and 470 MHz~510 MHz, only by adjusting the bias voltage $V_{bias}$.

More generally, in some embodiments, the bandwidth range in which adaptive impedance matching can be performed by the receiving circuit 100 with the example structure according to the embodiments of the present disclosure may depend on a frequency range of local oscillator signals supported by a local oscillator included in the frequency mixing module 102 described below. For example, the first bandwidth range described herein may be any bandwidth range below the frequency of 3 GHz. More specifically, the first bandwidth range described herein may include, but is not limited to, 220 MHz~240 MHz, 433 MHz (e.g., 433.05 MHz~433.79 MHz) and 915 MHz (e.g., 902 MHz~928 MHz) in the ISM band, 470 MHz~510 MHz, 240 MHz~470 MHz, 220 MHz~510 MHz, etc.

Returning to FIG. 2, in some embodiments, the frequency mixing module 102 may be a quadrature passive mixer (e.g., a switch mixer), which may include a local oscillator (not shown) and first, second, third and fourth switching transistors M1, M2, M3 and M4. The local oscillator may generate a first local oscillator signal LO_I+, a second local oscillator signal LO_Q+, a third local oscillator signal LO_I-, and a fourth local oscillator signal LO_Q-, whose phases are sequentially increased by 90 degrees. For example, the first local oscillator signal LO_I+ may have a phase offset of 0 degrees, the second local oscillator signal LO_Q+ may have a phase offset of 90 degrees, the third local oscillator signal LO_I- may have a phase offset of 180 degrees, and the fourth local oscillator signal LO_Q- may have a phase offset of 360 degrees. In some embodiments, other aspects (e.g., frequency, amplitude, etc.) of the first local oscillator signal to the fourth local oscillator signal may be identical except for different phase offsets. The first local oscillator signal LO_I+, the second local oscillator signal LO_Q+, the third local oscillator signal LO_I–, and the fourth local oscillator signal LO_Q– may be connected (e.g., directly or through a corresponding capacitor) to a gate of a corresponding one of the first switching transistor M1, the second switching transistor M2, the third switching transistor M3, and the fourth switching transistor M4 respectively, to control their switching states. In this case, switching frequency of each switch is controlled by the local oscillator signal, so that frequency mixing of the input signal can be enabled.

Each of the first switching transistor M1, the second switching transistor M2, the third switching transistor M3, and the fourth switching transistor M4 may be one of any type of transistors such as a P-type transistor, an N-type transistor, etc., without limitation herein.

In the embodiment shown in FIG. 2, the first to fourth switching transistors M1 to M4 may be N-type transistors. Sources of the first to fourth switching transistors M1 to M4 may be connected to the output end P2 of the first amplification module 101, respectively. In addition, a gate of the first switching transistor M1 may be connected to the first local oscillator signal LO_I+, and a drain thereof may be connected to a first output path PATH_I of the frequency mixing module 102, for example, via a first path output point P4. A gate of the second switching transistor M2 may be connected to the third local oscillator signal LO_I–, and a drain thereof may be connected to the first output path PATH_I of the frequency mixing module 102, for example, via the first path output point P4. A gate of the third switching transistor M3 may be connected to the second local oscillator signal LO_Q+, and a drain thereof may be connected to a second output path PATH_Q of the frequency mixing module 102. A gate of the fourth switching transistor M4 may be connected to the fourth local oscillator signal LO_Q–, and a drain thereof may be connected to the second output path PATH_Q of the frequency mixing module 102. In this embodiment, the frequency mixing module 102 may output both an in-phase down-converted signal and a quadrature down-converted signal through the two output paths PATH_I and PATH_Q.

In some embodiments, specific control signals may also be connected to the gates of the corresponding one of the first switching transistor M1, the second switching transistor M2, the third switching transistor M3, and the fourth switching transistor M4, for example, through corresponding resistors (not shown in the figures in order for simplifying the description), so that the switching of each transistor can be performed more smoothly, and at the same time, the conversion gain of the mixer can be optimized by adjusting appropriate values of the control signals.

In some embodiments, an isolation capacitor may be connected between the output end P2 of the first amplification module 101 and the input end P3 of the frequency mixing module 102 to isolate a direct current (DC) component in the circuit.

In some embodiments, the second amplification module 103 may include one or more transimpedance amplifiers (e.g., TIA1 and TIA2 as shown in FIG. 2). Input ends of the one or more transimpedance amplifiers may be connected to one or more output paths of the frequency mixing module 102 respectively, and amplify signals output via the one or more output paths of the frequency mixing module 102 respectively. For example, the input end of TIA1 may be connected to the first output path PATH_I of the frequency mixing module 102, and the input end of TIA2 may be connected to the second output path PATH_Q of the frequency mixing module 102.

The operating principle of the receiving circuit 100 for adaptive impedance matching according to embodiments of the present disclosure will be further described below with reference to embodiments.

The following will take a scenario of radio frequency signal reception and impedance matching as an example. As shown in FIG. 2, the input signal INPUT may be a radio frequency voltage signal. Generally, when an input signal is transmitted in the air, it needs to be received by an antenna, and an characteristic impedance of the antenna end is 50 ohm. In order to transmit the energy received by the antenna to the inside of a chip without attenuation as much as possible, the receiving end of the chip (e.g., the receiving circuit 100) also needs an impedance matching to 50 ohm.

The active negative feedback low noise amplifier LNA in the receiving circuit 100 according to the embodiments of the present disclosure may convert the received RF voltage signal from voltage signal to current signal (e.g., RF current signal) and amplify it. Then, the amplified RF current signal may be input to a quadrature mixer in the next stage. The quadrature mixer may down-convert the RF current signal into (one or more) intermediate frequency or baseband current signals, and then transimpedance amplifier (TIA) converts the (one or more) intermediate frequency or baseband current signals into (one or more) intermediate frequency or baseband voltage signals and amplifies them.

The active negative feedback structure (e.g., feedback transistor structure, etc.) included in the active negative feedback low noise amplifier LNA according to the embodiments of the present disclosure can provide impedance matching in an ultra-wide bandwidth range (e.g., 230 MHz~510 MHz, etc.). Meanwhile, the current multiplexing structure in the active negative feedback low noise amplifier LNA according to the embodiments of the present disclosure (e.g., the structure of the first amplifying transistor MP1 plus the second amplifying transistor MN1) only needs half the current to obtain the same performance, such as the same equivalent transconductance, when compared with a structure of a single amplifying transistor.

Figure 3:
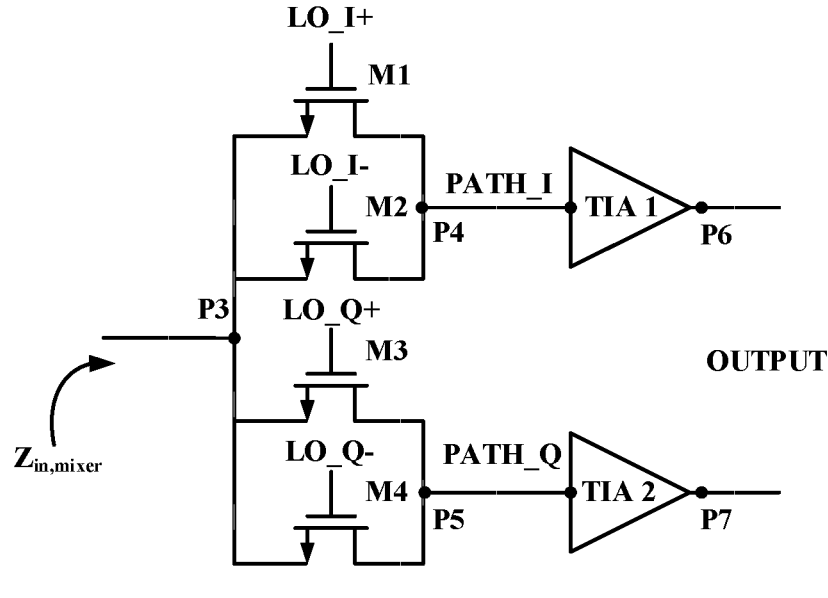
FIG. 3 shows a view of an equivalent impedance of a mixer and a transimpedance amplifier seen from the input end of the quadrature mixer according to the embodiments of the present disclosure.

Referring to FIG. 2, an equivalent impedance $Z_{in,LNA}$ of the input end of the active negative feedback low noise amplifier LNA in the receiving circuit 100 according to the embodiments of the present disclosure is mainly determined by the transconductances of the feedback transistor $MN_{fb}$, the first amplification transistor MP1 and the second amplification transistor MN1, and an effective equivalent impedance of the mixer and the transimpedance amplifiers (e.g., TIA1 and TIA2) seen from the input end of the quadrature mixer. For example, without considering the feedback resistance Rf, the equivalent impedance $Z_{in,LNA}$ may be defined by the following equation (1):

$$Z_{in,LNA} = \frac{1}{gm_{fb} * \left(1 + gm_{n,p} * Z_{in,mixer}\right) + sC_{gs}} \tag{1}$$

where, $gm_{fb}$ is a transconductance of the feedback transistor $MN_{fb}$, $gm_{n,p}$ is an equivalent transconductance of the first amplification transistor MP1 and the second amplification transistor MN1 (for example, it may be a sum of a transconductance $gm_p$ of the first amplification transistor MP1 and a transconductance $gm_n$ of the second amplification transistor MN1), $C_{gs}$ is an equivalent parasitic capacitance of the first amplification transistor MP1 and the second amplification transistor MN1, s is a parameter corresponding to a specific frequency range, and $Z_{in,mixer}$ is the effective equivalent impedance of the mixer and the transimpedance amplifiers (e.g., TIA1 and TIA2) seen from the input end of the quadrature mixer as shown in FIG. 3.

Since the transconductance of the feedback transistor and/or amplification transistor of the receiving circuit 100 according to the structure of the embodiment of the present disclosure and the effective equivalent impedance $Z_{in,mixer}$ of the input end of the mixer can maintain at a same value in a very wide bandwidth range (e.g., 470 MHz~510 MHz, etc.), it can be seen from the above equation (1), a specific transconductance of the feedback transistor and/or amplification transistor and a specific effective equivalent impedance $Z_{in,mixer}$ of the input end of the mixer can enable the receiving circuit 100 to maintain its equivalent impedance at a specific value (e.g., 50 ohm) in a very wide bandwidth range (e.g., 470 MHz~510 MHz, etc.).

On the other hand, when the transconductance of the feedback transistor and/or amplification transistor of the receiving circuit 100 is a fixed value, it can be seen from the above equation (1) (for convenience of description, $sC_{gs}$ is not considered) that the equivalent impedance $Z_{in,LNA}$ of the input end of the active negative feedback low noise amplifier LNA in the receiving circuit 100 according to the embodiments of the present disclosure will change with the change of the effective equivalent impedance $Z_{in,mixer}$ of the input end of the mixer.

Figure 4:
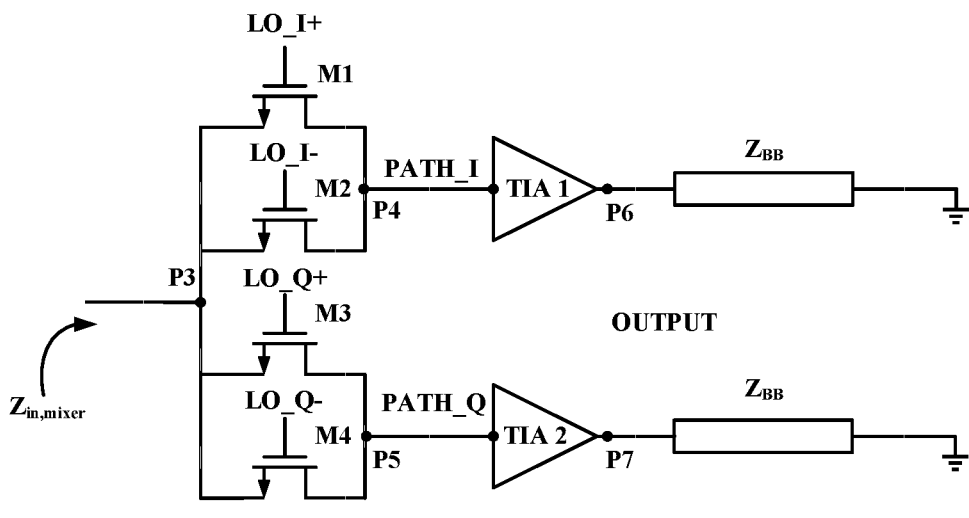
FIG. 4 shows a view of an equivalent impedance of a mixer and a transimpedance amplifier seen from the input end of the quadrature mixer in consideration of a load according to the embodiments of the present disclosure.

Further, FIG. 4 shows a view of an equivalent impedance of a mixer and a transimpedance amplifier seen from the input end of the quadrature mixer in consideration of a load according to the embodiments of the present disclosure.

When considering the load, the effective equivalent impedance $Z_{in,mixer}$ of the input end of the mixer may be defined by the following equation (2):

$$Z_{in,mixer} = R_{sw} + \frac{2}{\pi^2}[Z_{BB}(\omega - \omega_{lo}) + Z_{BB}(\omega + \omega_{lo})] \qquad (2)$$

where, $R_{sw}$ is an equivalent reactance of the switches (e.g., switching transistors M1 to M4) in the mixer, $\omega_{lo}$ is the frequency of the switches in the mixer (e.g., the frequency of the local oscillator signal), $\omega$ is the frequency of the input signal INPUT, and $Z_{BB}$ is an equivalent impedance of the load.

As shown in the above equation (2), the effective equivalent impedance $Z_{in,mixer}$ of the input end of the mixer is positively correlated with the equivalent reactance of the switches in the mixer and the frequency of the local oscillator signal LO. Combined with that obtained from the above equation (1): $Z_{in,LNA}$ will change will the change of the effective equivalent impedance $Z_{in,mixer}$ of the input end of the mixer, therefore, the overall input equivalent impedance $Z_{in,LNA}$ in the receiving circuit 100 according to the embodiments of the present disclosure may change with the change of the frequency of the local oscillator signal LO. For example, when the frequency of the local oscillator signal LO is 490 MHz, the overall input equivalent impedance $Z_{in,LNA}$ in the receiving circuit 100 according to the embodiments of the present disclosure may have an effective equivalent impedance of, for example, 50 ohm in the frequency of 490 MHz or in a specific bandwidth range centered on this frequency, while having a high impedance in other bandwidth ranges; and when the frequency of the local oscillator signal LO is 500 MHz, the overall input equivalent impedance $Z_{in,LNA}$ in the receiving circuit 100 according to the embodiments of the present disclosure may have an effective equivalent impedance of, for example, 50 ohm in the frequency of 500 MHz or in a specific bandwidth range centered on this frequency, while having a high impedance in other bandwidth ranges. Therefore, the receiving circuit 100 according to the embodiments of the present disclosure further has a frequency selection characteristic, which may isolate the blocking signal while performing impedance matching, thus the performance of the receiver may be improved.

More generally, assuming that there are 40 available signal transmission tunnels (channels) in an available bandwidth of 40 MHz from 470 MHz to 510 MHz, the bandwidth of each transmission tunnel (channel) is 1 MHz. The radio frequency transceiver may select a specific channel among these 40 channels for current data transmission. The baseband and software may select a local oscillator signal (LO) of the corresponding frequency according to the selected different channel, and at the same time, the impedance matching of the receiving circuit 100 according to the embodiments of the present disclosure may be automatically adjusted to the channel of the corresponding frequency without additional circuits.

Next, FIG. 5 shows a flowchart of an operating method 500 of the receiving circuit 100 for adaptive impedance matching according to the embodiments of the present disclosure.

As described above, the receiving circuit 100 for adaptive impedance matching according to the embodiments of the present disclosure may include a first amplification module 101, a frequency mixing module 102, and a second amplification module 103. In step S501, an input signal INPUT input from an input end of the first amplification module 101 may be amplified by the first amplification module 101 to generate a first amplified signal. In some embodiments, the first amplification module 101 may include an active negative feedback structure for providing adaptive impedance matching in a first bandwidth range. In step S502, the first amplified signal may be down-converted by the frequency mixing module 102 to generate a down-converted signal. In step S503, the down-converted signal may be amplified by the second amplification module 103 to generate an output signal OUTPUT.

It should be understood that the operating method 500 may further include any operating methods and steps related to the receiving circuit 100 described herein.

The whole or parts of the hardware computing apparatuses described in the present disclosure may be implemented by various suitable hardware means, including but not limited to FPGA, ASIC, SoC, discrete gate or transistor logic, discrete hardware components, or any combination thereof.

The block diagrams of circuits, devices, apparatuses, equipment, and systems involved in the present disclosure are only exemplary examples, and are not intended to require or imply that they must be connected, arranged, or configured in the ways shown in the block diagrams. As will be realized by those skilled in the art, these circuits, devices, apparatuses, equipment and systems may be connected, arranged or configured in any way, as long as the desired purpose can be achieved.

Although the present disclosure has been described with exemplary embodiments, various changes and modifications can be suggested to those skilled in the art. The present disclosure is intended to encompass such changes and modifications as fall within the scope of the appended claims.

Any description in the present disclosure should not be understood as implying that any specific element, step or function is a necessary element that must be included in the scope of the claims. The scope of the subject matter is limited only by the claims.

The exemplary embodiments according to the present disclosure have been disclosed herein, and although specific terms are adopted, they are used and explained in a general and descriptive sense only, and not for the purpose of limitation. In some cases, features, characteristics and/or elements described in connection with specific embodiments may be used alone or in combination with features, characteristics and/or elements described in connection with other embodiments, unless otherwise stated. Therefore, it will be understood by those skilled in the art that various changes in form and details can be made in the present disclosure without departing from the spirit and scope of the claims.

What is claimed is:

1. A receiving circuit for adaptive impedance matching, including:

a first amplification module configured to amplify an input signal input from an input end of the first amplification module to generate a first amplified signal;

a frequency mixing module, an input end of which is connected to an output end of the first amplification module, and configured to down-convert the first amplified signal to generate a down-converted signal; and a second amplification module, an input end of which is connected to an output end of the frequency mixing module, and configured to amplify the down-converted signal to generate an output signal, wherein the first amplification module includes an active negative feedback structure for providing adaptive impedance matching in a first bandwidth range, wherein the active negative feedback structure includes a feedback transistor, a bias transistor, a first amplification transistor, and a second amplification transistor, wherein, a source of the first amplification transistor is connected to a power supply voltage, a gate of the first amplification transistor is connected to the input end of the first amplification module, and a drain of the first amplification transistor is connected to the output end of the first amplification module;

a drain of the second amplification transistor is connected to the output end of the first amplification module, a gate of the second amplification transistor is connected to the input end of the first amplification module, and a source of the second amplification transistor is connected to a ground voltage;

a drain of the feedback transistor is connected to the power supply voltage, a gate of the feedback transistor is connected to the output end of the first amplification module, and a source of the feedback transistor is connected to the input end of the first amplification module; and a drain of the bias transistor is connected to the input end of the first amplification module, a gate of the bias transistor is connected to a bias voltage, and a source of the bias transistor is connected to the ground voltage.

2. The receiving circuit according to claim 1, wherein a transconductance of the feedback transistor is adjusted via the bias voltage.

3. The receiving circuit according to claim 1, wherein the frequency mixing module includes a quadrature passive mixer, which includes a local oscillator and first to fourth switching transistors, wherein the local oscillator generates first to fourth local oscillator signals whose phases are sequentially increased by 90 degrees to control switching states of the first to fourth switching transistors.

4. The receiving circuit according to claim 3, wherein, sources of the first to fourth switching transistors are respectively connected to the output ends of the first amplification module;

a gate of the first switching transistor is connected to the first local oscillator signal, and a drain of the first switching transistor is connected to a first output path of the frequency mixing module;

a gate of the second switching transistor is connected to the third local oscillator signal, and a drain of the second switching transistor is connected to the first output path of the frequency mixing module;

a gate of the third switching transistor is connected to the second local oscillator signal, and a drain of the third switching transistor is connected to a second output path of the frequency mixing module; and a gate of the fourth switching transistor is connected to the fourth local oscillator signal, and a drain of the fourth switching transistor is connected to the second output path of the frequency mixing module.

5. The receiving circuit according to claim 1, wherein the second amplification module includes one or more transimpedance amplifiers, input ends of which are respectively connected to one or more output paths of the frequency mixing module, and respectively amplify signals output via the one or more output paths of the frequency mixing module.

6. The receiving circuit according to claim 1, wherein the first bandwidth range is determined based at least in part on transconductance of the feedback transistor.

7. The receiving circuit according to claim 1, wherein the first bandwidth range is any one or more of 220 MHz to 240 MHz, 433.05 MHz to 433.79 MHz, 902 MHz to 928 MHz, 240 MHz to 470 MHz, 470 MHz to 510 MHz and 220 MHz to 510 MHz.

8. The receiving circuit according to claim 1, wherein the input signal is a radio frequency voltage signal, and the first amplified signal is a radio frequency current signal.

9. The receiving circuit according to claim 1, wherein the down-converted signal is one or more intermediate frequency or baseband current signals, and the output signal is one or more intermediate frequency or baseband voltage signals.

10. An operating method of a receiving circuit for adaptive impedance matching, the receiving circuit including a first amplification module, a frequency mixing module and a second amplification module, the method including:

amplifying, by the first amplification module, an input signal input from an input end of the first amplification module to generate a first amplified signal;

down-converting, by the frequency mixing module, the first amplified signal to generate a down-converted signal; and amplifying, by the second amplification module, the down-converted signal to generate an output signal, wherein the first amplification module includes an active negative feedback structure for providing adaptive impedance matching in a first bandwidth range, wherein the active negative feedback structure includes a feedback transistor, a bias transistor, a first amplification transistor and a second amplification transistor, wherein, a source of the first amplification transistor is connected to a power supply voltage, a gate of the first amplification transistor is connected to the input end of the first amplification module, and a drain of the first amplification transistor is connected to an output end of the first amplification module;

a drain of the second amplification transistor is connected to the output end of the first amplification module, a gate of the second amplification transistor is connected to the input end of the first amplification module, and a source of the second amplification transistor is connected to a ground voltage;

a drain of the feedback transistor is connected to the power supply voltage, a gate of the feedback transistor is connected to the output end of the first amplification module, and a source of the feedback transistor is connected to the input end of the first amplification module; and a drain of the bias transistor is connected to the input end of the first amplification module, a gate of the bias transistor is connected to a bias voltage, and a source of the bias transistor is connected to the ground voltage.

* * * * *